US012566656B2

(12) United States Patent
  Khayrallah

(10) Patent No.: US 12,566,656 B2
(45) Date of Patent: Mar. 3, 2026

(54) ANALYZING BIT ERROR DATA TO DETERMINE A ROOT CAUSE OF ERRORS IN A DIGITAL SYSTEM

(71) Applicant: EXFO Taiwan Inc., Hsinchu City (TW)

(72) Inventor: Jean Khayrallah, Zhubei (TW)

(73) Assignee: EXFO Taiwan Inc., Hsinchu City (TW)

( * ) Notice: Subject to any disclaimer, the term of this patent is extended or adjusted under 35 U.S.C. 154(b) by 14 days.

(21) Appl. No.: 18/672,282

(22) Filed: May 23, 2024

(65) Prior Publication Data

US 2024/0405917 A1 Dec. 5, 2024

Related U.S. Application Data

(60) Provisional application No. 63/516,221, filed on Jul. 28, 2023, provisional application No. 63/469,578, filed on May 30, 2023.

(51) Int. Cl.
  *G06F 11/07* (2006.01)
  *G01R 31/317* (2006.01)
  (Continued)

(52) U.S. Cl.
  CPC ........ *G06F 11/079* (2013.01); *G01R 31/3171* (2013.01); *H04L 1/0061* (2013.01);
  (Continued)

(58) Field of Classification Search
  CPC . G06F 11/079; G01R 31/3171; H04L 1/0061; H04L 1/203; H04L 1/244; H04L 25/03197
  See application file for complete search history.

(56) References Cited

U.S. PATENT DOCUMENTS 7,082,556 B2 7/2006 Fishman et al.
7,093,172 B2 8/2006 Fan et al.
  (Continued)

OTHER PUBLICATIONS

K. Niewiadomski et al "Comparative Analysis of Deterministic and Random Modulations Based on Mathematical Models of Transmission Errors in Series Communication," in IEEE Transactions on Power Electronics, vol. 37, No. 10, pp. 11985-11995, Oct. 2022 (Year: 2022).*

(Continued)

*Primary Examiner* — Cynthia Britt

(74) *Attorney, Agent, or Firm* — Baratta Law PLLC; Lawrence A. Baratta, Jr.

(57) ABSTRACT

Systems and methods are provided for detecting bit errors and further processing bit error information. A method, according to one implementation, includes the step of receiving a binary test sequence pattern generated by a pattern generator at an input to a digital communications system under test, wherein the binary test sequence pattern includes a plurality of sub-patterns. The method also includes the step of receiving an output binary sequence from an output of the digital communications system. Also, the method includes comparing the binary test sequence pattern with the output binary sequence to detect bit errors. Based on correlation characteristics between the bit errors and each of the sub-patterns, the method also includes the step of determining whether the bit errors are caused by random factors or are caused by deterministic factors associated with the digital communications system.

20 Claims, 3 Drawing Sheets

(51) Int. Cl.

| | | |
|---|---|---|
| *H04L 1/00* | (2006.01) | |
| *H04L 1/20* | (2006.01) | |
| *H04L 1/24* | (2006.01) | |
| *H04L 25/03* | (2006.01) | |

(52) U.S. Cl.

CPC .............. *H04L 1/203* (2013.01); *H04L 1/244* (2013.01); *H04L 25/03197* (2013.01)

(56) References Cited

U.S. PATENT DOCUMENTS

| | | | |
|---|---|---|---|
| 7,203,610 B2 | 4/2007 | Tabatabaei et al. | |
| 7,231,558 B2 | 6/2007 | Gentieu et al. | |
| 7,486,725 B2 | 2/2009 | Chen et al. | |
| 7,774,669 B2 | 8/2010 | Romero et al. | |
| 7,809,516 B2 * | 10/2010 | Yamaguchi ........ | G01R 31/3171 |
| | | | 702/69 |
| 8,898,526 B1 * | 11/2014 | Noujeim ................... | H04L 1/24 |
| | | | 370/242 |
| 9,042,427 B2 | 5/2015 | Singh et al. | |
| 9,401,803 B2 | 7/2016 | Kim et al. | |
| 10,560,302 B2 | 2/2020 | Chakraborty et al. | |
| 10,733,347 B2 * | 8/2020 | Dmitriev-Zdorov ........................ | |
| | | | G06F 30/367 |
| 11,009,546 B2 | 5/2021 | Hojabri et al. | |
| 2004/0181714 A1 | 9/2004 | Jungerman | |
| 2004/0268190 A1 | 12/2004 | Kossel et al. | |
| 2005/0071399 A1 | 3/2005 | Bonaccio et al. | |
| 2005/0075810 A1 * | 4/2005 | Laquai ............. | G01R 31/31709 |
| | | | 702/69 |
| 2005/0132258 A1 * | 6/2005 | Chen ...................... | H04L 1/245 |
| | | | 714/704 |
| 2007/0156360 A1 | 7/2007 | Romero | |

| | | | |
|---|---|---|---|
| 2009/0213918 A1 * | 8/2009 | Waschura ............... | H04L 1/205 |
| | | | 714/704 |
| 2010/0090709 A1 | 4/2010 | Watanabe et al. | |
| 2010/0246650 A1 * | 9/2010 | Erb .................. | G01R 31/31708 |
| | | | 375/224 |
| 2016/0004804 A1 * | 1/2016 | Dmitriev-Zdorov ........................ | |
| | | | G06F 30/367 |
| | | | 703/2 |
| 2018/0060225 A1 * | 3/2018 | Tao ...................... | G06F 11/3692 |
| 2024/0168867 A1 * | 5/2024 | Rukletsov ........... | G06F 11/3692 |
| 2024/0176726 A1 * | 5/2024 | Lemberg ............. | G06F 11/3636 |

OTHER PUBLICATIONS

Cheng et al., Jump the Q: A Fast Jitter Tolerance Measurement Method Using Q-Statistical Model, Dec. 31, 2010.

Park et al., Polynomial Model-Based Eye Diagram Estimation Methods for LFSR-Based Bit Streams in PRBS Test and Scrambling, Dec. 31, 2019.

E. Cheng, J. Kho, Y. L. Tan, W. W. Lo and M. O. Wong, "Jump the Q: A fast jitter tolerance measurement method using Q-statistical model," 2010 IEEE Electrical Design of Advanced Package & Systems Symposium, Singapore, 2010, pp. 1-4, [retrieved on Mar. 17, 2023]. Retrieved from the Internet:< URL: https://ieeexplore. ieee.org/document/5683044> <DOI:10.1109/EDAPS.2010. 5683044>.

J. Park et al., "Polynomial Model-Based Eye Diagram Estimation Methods for LFSR-Based Bit Streams in PRBS Testand Scrambling," in IEEE Transactions on Electromagnetic Compatibility, vol. 61, No. 6, pp. 1867-1875, Dec. 2019, [retrieved on Mar. 17, 2023]. Retrieved from the Internet:< URL: https://ieeexplore.ieee.org/ document/8667029> <DOI:10.1109/TEMC.2019.2900055>.

\* cited by examiner

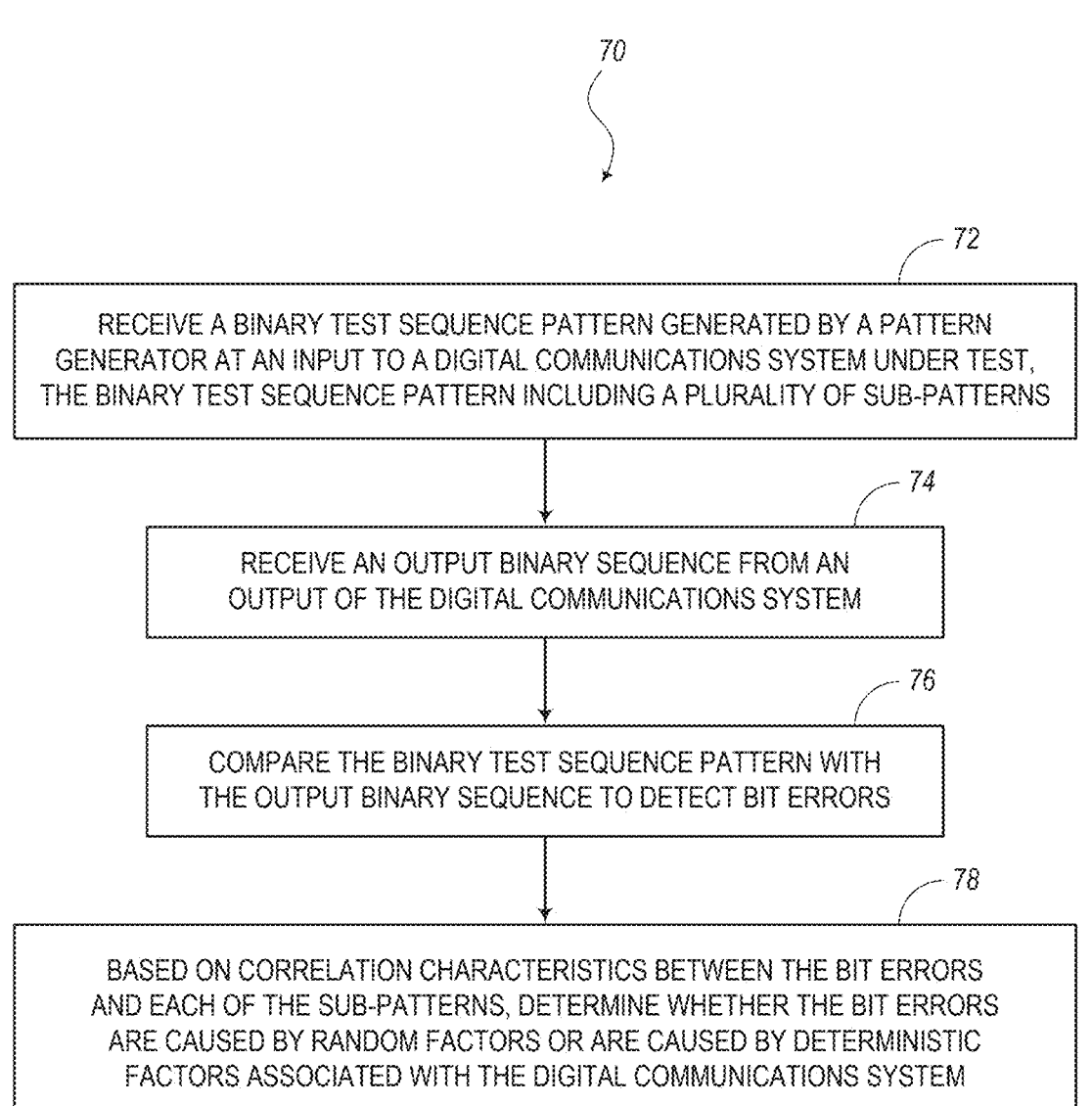

*70*

*72*

RECEIVE A BINARY TEST SEQUENCE PATTERN GENERATED BY A PATTERN GENERATOR AT AN INPUT TO A DIGITAL COMMUNICATIONS SYSTEM UNDER TEST, THE BINARY TEST SEQUENCE PATTERN INCLUDING A PLURALITY OF SUB-PATTERNS

*74*

RECEIVE AN OUTPUT BINARY SEQUENCE FROM AN OUTPUT OF THE DIGITAL COMMUNICATIONS SYSTEM

*76*

COMPARE THE BINARY TEST SEQUENCE PATTERN WITH THE OUTPUT BINARY SEQUENCE TO DETECT BIT ERRORS

*78*

BASED ON CORRELATION CHARACTERISTICS BETWEEN THE BIT ERRORS AND EACH OF THE SUB-PATTERNS, DETERMINE WHETHER THE BIT ERRORS ARE CAUSED BY RANDOM FACTORS OR ARE CAUSED BY DETERMINISTIC FACTORS ASSOCIATED WITH THE DIGITAL COMMUNICATIONS SYSTEM

FIG. 4

ANALYZING BIT ERROR DATA TO DETERMINE A ROOT CAUSE OF ERRORS IN A DIGITAL SYSTEM

CROSS-REFERENCE TO RELATED APPLICATION

The present application claims the benefit of priority under 35 U.S.C. § 119(e) to Provisional App. No. 63/469,578, filed May 30, 2023, and to Provisional App. No. 63/516,221, filed Jul. 28, 2023, the contents of each are incorporated by reference herein in their entirety.

TECHNICAL FIELD

The present disclosure generally relates to networking systems and methods. More particularly, the present disclosure relates to determining bit errors in a digital transmission device or system and analyzing the bit errors to determine a root cause.

BACKGROUND

Generally, electrical devices can be defined by the type of signals they can handle (i.e., having an ability to handle analog signals, digital signals, or both). As is known, digital systems are configured to transmit and process digital or binary signals consisting of a plurality of bits, each bit having a value of zero (0) or one (1). One way to test or characterize these digital systems includes counting the number of bit errors that are experienced when a test signal is transmitted through the device or system. From this number of bit errors, for example, a Bit Error Rate (BER) can be calculated, which is equal to the number of bit errors per unit time. Also, a bit error ratio (not to be confused with bit error "rate") can also be calculated, which is equal to the number of bit errors per total number of transmitted test bits. To characterize a digital system (e.g., transmission link, fiber optic communication channel, electrical device or system, etc.), a BER test may be performed, which may involve launching a known binary sequence pattern into one end (e.g., an input) of the digital system under test and then monitoring the bit sequence at the other end (e.g., an output) of the digital system. The BER tester can compare the two sequences to determine if any transmission bit errors are present. From the number of bit errors, the BER or bit error ratio can be calculated.

BRIEF SUMMARY

The present disclosure focuses on systems, methods, and computer-readable media for detecting bit errors in a digital system and then further processing the bit errors in order to extract information that can be used to determine if the bit errors are caused by uncontrollable random factors or are caused by deterministic factors of the digital system under test that might be controllable in some cases. Thus, the systems and methods are configured for detecting bit errors and determining the cause of the bit errors.

In one implementations, a method may include the step of receiving a binary test sequence pattern generated by a pattern generator at an input to a digital communications system under test, where the binary test sequence pattern may include a plurality of sub-patterns. The method may further include the step of receiving an output binary sequence from an output of the digital communications system. Furthermore, the method may include the step of comparing the binary test sequence pattern with the output binary sequence to detect bit errors. Based on correlation characteristics between the bit errors and each of the sub-patterns, the method may further include the step of determining whether the bit errors are caused by random factors or are caused by deterministic factors associated with the digital communications system.

According to additional embodiments, the method may be executed whereby each sub-pattern is configured to target certain types of deterministic factors associated with the digital communications system. The deterministic factors, for instance, may be related to the transmission bandwidth of the digital communications system. More specifically, bit errors that have error peaks focused on specific sub-patterns may be indicative of errors caused by deterministic factors associated with the digital communications system, versus errors that show up randomly in different places.

In some embodiments, the method may further include the step of determining one or more remediation procedures with respect to the digital communications system for reducing the number of errors caused by the deterministic factors associated with the digital communications system. The method may further include the step of detecting one or more of a bit error rate and a bit error ratio, wherein the bit error rate is based on the number of detected bit errors per unit time and the bit error ratio is based on the number of detected bit errors versus a total number of bits in the binary test sequence pattern.

Additionally, the binary test sequence pattern may be a Pseudo-Random Binary Sequence (PRBS) and/or a user-defined sequence. Also, each of the sub-patterns may have a predetermined binary sequence for targeting a specific characteristic of the digital communications system. In some embodiments, the method may further include the step of analyzing the bit errors to extract metrics related to one or more of jitter, signal performance, and reflection. The method, in some implementations, may also include the step of instructing the pattern generator to incorporate error correction code according to Forward Error Correction (FEC) techniques to reduce the number of bit errors.

In some embodiments, a first group of sub-patterns may be defined as high-bandwidth sequences and a second group of sub-patterns may be defined as low-bandwidth sequences. Also, each sub-pattern may be repeated in the binary test sequence pattern multiple times. It may be noted that bit errors that are caused by deterministic factors associated with the digital communications system may be the result of transmission line faults, optical fiber faults, defective hardware, interference, distortion, reflection issues, bandwidth issues, excessive attenuation, among other factors. On the other hand, bit errors that are caused by random factors may be the result of noise, jitter, environmental factors, bit synchronization issues, among other factors.

The method can also include the step of synchronizing the binary test sequence pattern with the output binary sequence to enable the binary test sequence pattern to be properly compared with the output binary sequence. The binary test sequence pattern, for example, may include more than $10^{20}$ bits. Also, the method may further include the step of displaying waveforms, which may be indicative of bit errors, on an oscilloscope.

BRIEF DESCRIPTION OF THE DRAWINGS

The present disclosure is illustrated and described herein with reference to the various drawings. Like reference numbers are used to denote like components/steps, as appropriate. Unless otherwise noted, components depicted in the drawings are not necessarily drawn to scale.

FIG. 4 is a flow diagram illustrating a method for detecting bit errors and determining the cause of the bit errors, according to various embodiments.

DETAILED DESCRIPTION

Figure 1:
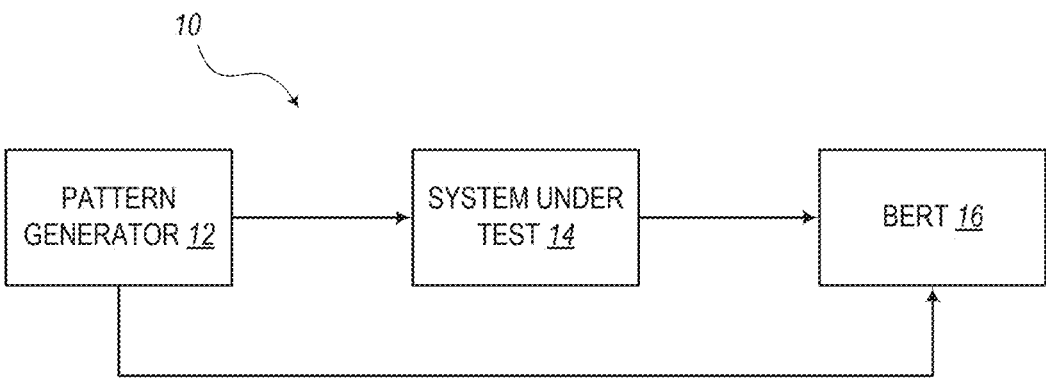
FIG. 1 is a block diagram illustrating a general test setup for determining bit errors in a digital system, according to various embodiments.

The present disclosure relates to systems and methods for characterizing the performance of digital transmission systems. In particular, a tester may be used to count the number of bit errors of a binary test sequence applied to a digital transmission system under test. Again, from the number of bit errors, a Bit Error Rate (BER) (expressed as a quantity over time) and/or bit error ratio (expressed as a fraction or percentage) may be calculated. The bit error rate or bit error ratio may then be used to determine the quality or acceptability of transmission through the system under test.

Typically, conventional BER testing simply includes outputting the BER or bit error ratio. However, the systems and methods of the present disclosure define embodiments which further analyze the bit error information and provide additional characterizations of the digital system. That is, instead of simply providing values related to bit errors, the present disclosure is configured to further analyze the bit errors in order to determine a root cause of the errors. Of course, this additional information can be valuable in that a technician can determine whether bit errors observed during a BER test are related to random factors or whether they are related to deterministic factors that might point to particular issues in the digital system. With this additional knowledge, the technician may then be able to take remediation steps to fix specific problems in the digital system to thereby reduce the bit errors.

It may be noted that test signals over a communication channel may experience issues that can cause bit errors, whereby the issues may be due to noise, interference, distortion, bit synchronization errors, etc. The bit error testing devices described in the present disclosure are configured to analyze the bit error data with respect to certain "sub-patterns" within the entire bit sequence pattern. The embodiments of the present disclosure are configured to determine if there is a correlation between bit errors and certain sub-patterns. That is, if there is number of bit errors regardless of the sub-pattern, this scenario may be indicative of random bit errors that would result regardless of the bit sequence used in the test. However, if the number of bit errors is observed as being dependent on specific sub-patterns, this scenario may be indicative of deterministic errors that may result based on specific bit sequences that can be used to test various aspects of the digital system.

That is, the present disclosure looks at error peaks focused on specific sub-patterns versus error that are randomly showing up in different places. For example, if one sorts the sub-pattern by error count, it can be determined that the error count is located in a specific sub-pattern and the random one is just random; they can keep on changing, and the sorting will keep on changing cause it's randomly allocated. Here is an example in a one-hour test:

| Sub-pattern | Errors |
| --- | --- |
| 1010101 | 2000 |
| 11001100 | 1800 |
| 11001010 | 1600 |
| 101010001 | 100 |
| 1000101001 | 90 |
| 1001010101 | 50 |
| 10101001 | 60 |
| 1010100101 | 10 |
| 100111110 | 1 |

Accordingly, the embodiments of the present disclosure may be configured to perform a process for testing a digital communications system. In one implementation, the testing process (e.g., operating at an output of the digital communications system under test) may include a step of receiving a binary test sequence pattern generated by a pattern generator at an input to the digital communications system under test, where the binary test sequence pattern may include a plurality of sub-patterns. Next, the testing process may include the step of receiving an output binary sequence from an output of the digital communications system. The test may then include comparing the binary test sequence pattern with the output binary sequence to detect bit errors. Based on correlation characteristics between the bit errors and each of the sub-patterns, the testing process may include a step of determining whether the bit errors are caused by random factors or are caused by deterministic factors associated with the digital communications system.

FIG. 1 is a block diagram illustrating an embodiment of a test arrangement 10 for determining bit errors in a digital system. As shown, the test arrangement 10 includes a pattern generator 12 configured to generate a binary pattern or sequence, which is applied to one end of a system under test 14. Also, the same generated pattern is supplied to a Bit Error Rate Tester (BERT) 16. In addition to receiving the input test sequence, the BERT 16 is also configured to receive an output bit sequence at the one end of the system under test 14. The BERT 16 is configured to synchronize the test bits with the output bits and determine the number of bit errors for calculating BER or bit error ratio.

In addition to typical bit error testing, the BERT 16 is further configured to differentiate among a plurality of sub-patterns in the test sequence applied to the system under test 14. Each sub-pattern may include a certain sequence that is configured to test certain aspects of the system under test 14. Thus, by coordinating when the bit errors are detected with respect to the various sub-patterns, the BERT 16 is configured to determine one or more root causes of the errors. Again, if the bit errors are random, then the bit errors will spread throughout multiple sub-patterns in a distributed manner. However, if the bit errors are analyzed as be confined to only one particular sub-pattern (or only a limited number of sub-patterns), then the BERT 16 can conclude that the errors are caused by specific errors or faults in the system under test 14 and are not random. The BERT 16 can include a lookup table or the like for matching sub-patterns with specific types of errors.

Figure 2:
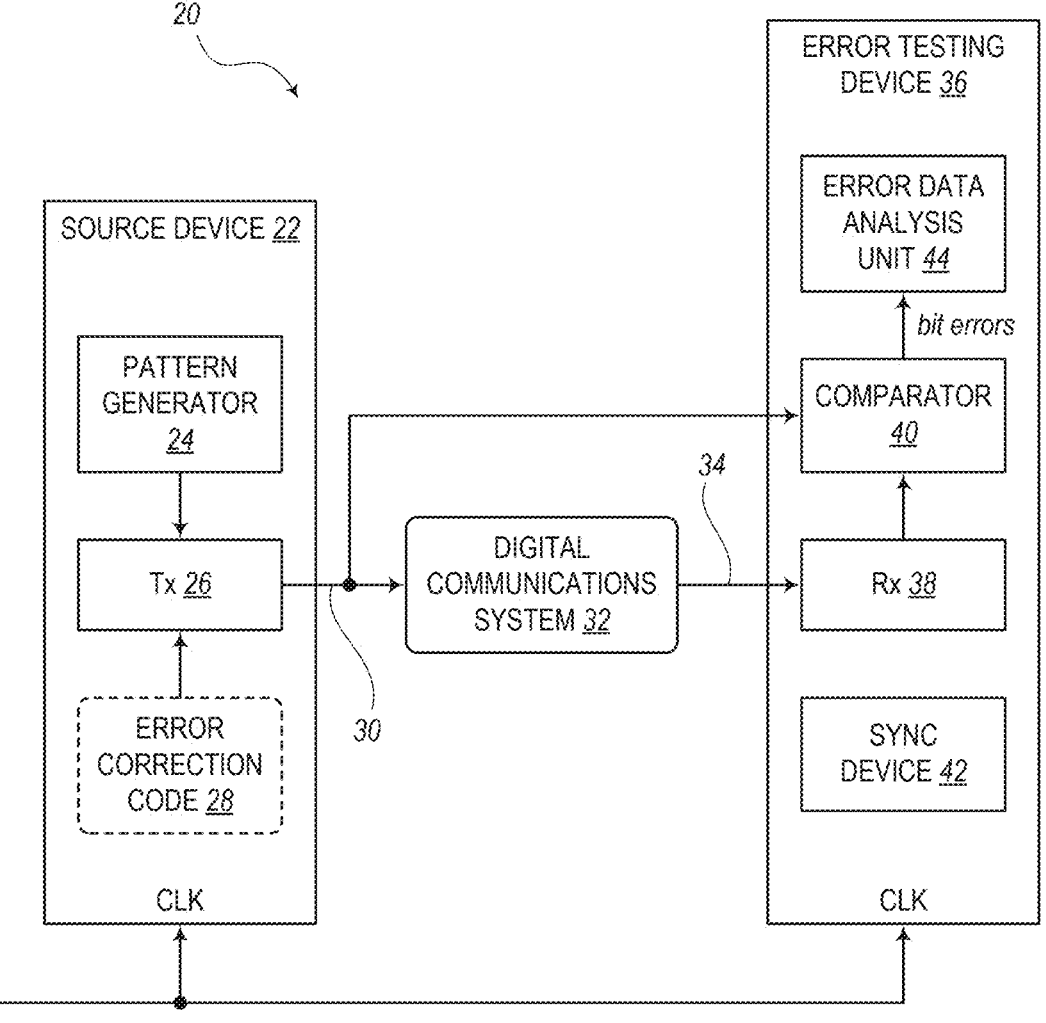
FIG. 2 is a block diagram illustrating a testing system for detecting bit errors, according to various embodiments.

FIG. 2 is a block diagram illustrating an embodiment of a testing system 20 for detecting bit errors. The testing system 20, as shown in FIG. 2, includes a source device 22 having a pattern generator 24 (e.g., pattern generator 12) and a transmitter 26. In some embodiments, the source device 22 may further include error correction code 28 configured for enabling Forward Error Correction (FEC). The transmitter 26 of the source device is configured to apply a predetermined test sequence 30 to a digital communications system 32 (e.g., system under test 14). According to the various embodiments of the present disclosure, the predetermined test sequence 30 may include a plurality of "sub-patterns," each having a sequence that is configured to test specific characteristics of the digital communications system 32.

An output sequence 34 is transmitted from an output of the digital communications system 32 and is provided to an error testing device 36. In particular, a receiver 38 of the error testing device 36 is configured to receive the output sequence 34. The predetermined test sequence 30 is also configured to bypass the digital communications system 32 and is applied to a comparator 40 of the error testing device 36. In addition, the output sequence 34, received by the receiver 38 is applied to the comparator 40.

The error testing device 36 further includes a synchronization device 42, which is configured to synchronize (or line up) the predetermined test sequence 30 with the output sequence 34 in the comparator 40 to allow the comparator 40 to determine if the output sequence 34 includes one or more bit errors with respect to the predetermined test sequence 30.

The comparator 40 can be configured to output information about bit errors detected in the output sequence 34 with respect to the predetermined test sequence 30. According to conventional systems, bit error information may simply include a number of bits errors detected, which may be used for calculating BER or bit error ratio. However, according to the embodiments of the present disclosure, the error testing device 36 further includes an error data analysis unit 44. The error data analysis unit 44 may be configured to analyze or process the bit errors with respect to the different sub-patterns of the predetermined test sequence 30.

If the error data analysis unit 44 determines that the bit errors occur in a manner that is substantially distributed across multiple sub-patterns, then the error data analysis unit 44 may categorize these bit errors as being indicative of random factors, which normally cannot be predicted or mitigated. However, if the error data analysis unit 44 determines that the bit errors tend to be substantially confined to one particular sub-pattern (or a small set of sub-patterns), i.e., error peaks focused on specific sub-patterns, then the error data analysis unit 44 may categorize these bit errors as being indicative of deterministic factors. That is, a set of sub-patterns may correspond to a portion of the predetermined test sequence 30 that may be designed to expose certain faults or other issues in the digital communications system 32 under test. If bit errors are primarily discovered in this set, then the error data analysis unit 44 may determine the specific faults or issues in the digital communications system 32.

With the knowledge of specific types of faults, a technician may then be able to take corrective actions to mitigate these faults, which may include, for example, replacing faulty communication devices in the digital communications system 32. In some embodiments, one solution to mitigating certain identified faults may include the introduction of the error correction code 28 at the source device 22.

Also, with the knowledge of specific types of faults, it is possible to optimize system parameters and configuration of the digital communications system 32.

In an embodiment, it is possible to characterize, display, provide a frequency-based graph of error distribution. This can be used to isolation and provide insight into where a problem is occurring, e.g., via a software or FPGA code. Instead of providing a BER value overall, this can provide a BER on specific frequencies. This can be extended to a histogram and/or eye diagram of the error for a frequency range selected by the sub-pattern.

Thus, the error testing device 36 is not only configured to count the number of bit errors in a test sequence, but also the error data analysis unit 44 may further process the bit errors by matching up the bit errors with the predetermined sub-patterns. When there is a correlation between bit errors and one or more specific sub-patterns, the error testing device 36 may then determine the cause or root cause of these errors.

In some embodiments, the predetermined test sequence 30 may include a sequence of bits referred to as a Pseudo-Random Binary Sequence (PRBS). The PRBS may include a repeating binary pattern that can be used to test the digital communications system 32 or other transmission systems and devices. The PRBS may include a sequence of N bits which exhibits statistical properties and behavior similar to a truly random sequence, it may actually be constructed strategically, particularly to test certain aspects of a digital system or device under test. In other embodiments, the predetermined test sequence 30 may include a user-defined pattern.

Again, there are different potential sources of errors in a digital transmission system (e.g., digital communications system 32 under test). Some errors may be caused by random factors, such as noise, interference, bit synchronization issues, etc., whereas other errors may potentially be caused by deterministic sources, such as faults or irregularities in the digital communications system 32. By identifying these faults or irregularities, the error data analysis unit 44 may be configured to provide an output in any suitable form to inform a technician of the potential causes, which may then be corrected to reduce the errors.

Errors that are not dependent upon the sequence of bits being transmitted are considered random (i.e., errors are present irrespective of the bit sequence). However, when errors show up on a specific bit sequence, they may be considered to be deterministic. Such errors may be caused by a faulty cable or trace or by other issues that are not random and will not normally be resolved without intervention.

Analyzing the errors to determine their deterministic and random components may therefore provide more knowledge on the source of the errors. For example, deterministic errors typically come from defects that will not go away on their own but can be treated (e.g., by changing a board layout, etc.). On the other end, random errors caused by some random factors (e.g., jitter, etc.) may come from uncontrollable sources (e.g., power noise, environmental factors, etc.) and may come and go randomly. Therefore, random factors will typically be more difficult to mitigate.

According to some implementations, the testing system 20 may be used with FEC analysis. The comparator 40 and error data analysis unit 44 of the error testing device 36 may be configured to test the predetermined test sequence 30 before error correction code 28 is added, which may be referred to as a "pre-FEC" sequence. Then after error correction code is inserted, the error testing device 36 may again test the output sequence 34, which may be referred to as a "post-FEC" sequence. The comparator 40 can compare the pre-FEC sequence with the post-FEC sequence to determine the effectiveness of the error correction code 28. If it is determined that the error correction code 28 is successful at reducing the number of bit errors, the source device 22 may continue to use the error correction code 28.

Therefore, one embodiment of test systems and methods may include a) launching a known binary sequence pattern (e.g., the predetermined test sequence 30) into the digital communications system 32 (e.g., a transmission link, fiber optic channel, electrical device/system, etc.), whereby the known binary sequence pattern is configured to include a plurality of sub-patterns. The error testing device 36 is configured to detect the bit sequence (e.g., output sequence 34) received on the other end of the transmission link or communications system. The comparator 40 is configured to compare the received bits with the known binary sequence to find transmission errors. This may be used for calculating BER, bit error ratio, or other similar metrics associated with the number of detected transmission bit errors. Next, the error data analysis unit 44 is configured to analyze the bit errors associated with each sub-pattern to determine whether the bit errors correspond to random or deterministic factors.

In some embodiments, each sub-pattern may be associated with a transmission bandwidth. Thus, the action of analyzing the bit errors associated with each sub-pattern may further comprise a process of calculating the bit errors, BER, or bit error ratio as a function of bandwidth. A particular component or factor of the bit errors that is uniform (as a function of bandwidth) may correspond to a random component, while a particular component or factor of the bit errors that varies (as a function of bandwidth) may correspond to a deterministic component.

Therefore, the systems and methods of the present disclosure are configured to perform data analysis of the bit error information. For example, the data analysis procedures of the error data analysis unit 44 may be analyze the bit errors, as described herein, in order to extract certain metrics, which may be indicative of jitter, signal performance, reflection, among others. These metrics can be calculated based on the bit error data obtained with respect to specific sub-patterns within the known binary sequence.

The predetermined test sequence 30 may include any number of sub-patterns, where each sub-pattern may comprise a sequence of bits which can be used to target deterministic or random errors. For example, some sub-patterns may target a specific bandwidth. Bit errors may be analyzed on such specific sub-patterns to therefore obtain the computations as a function of bandwidth. For example, a high-bandwidth sub-pattern may include the bit sequence "00000001000000." A high error rate on such high-bandwidth sub-patterns may be an indicator that the digital communications system 32 or other device or system under test does not have enough bandwidth. This may be indicative of a deterministic error because it may essentially be repeatable. In another example, a high-bandwidth sub-pattern may include the bit sequence "10101010101010."

In one example, a low-bandwidth sub-pattern may include the bit sequence "00000000111111." A high error rate on such a low-bandwidth sub-pattern may indicate that the transmission system under test has a reflection issue or bandwidth issue at that specific bandwidth. This may also be indicative of a deterministic error.

The error testing device 36 may be configured to analyze errors as a function of the sub-patterns. Errors that are found to be more uniform among the different sub-patterns (i.e., errors are present irrespective of the bandwidth of the bit sequence) may be considered to occur randomly. However, errors that are found to show up more specifically on certain sub-patterns are considered to occur deterministically (e.g., bandwidth-dependent errors).

Optionally, the predetermined test sequence 30 may be a user-defined pattern, which may take any form (e.g., other than a PRBS sequence). The user-defined pattern may be designed to enable the error data analysis unit 44 to analyze the bit error data in order to extract metrics indicative of various deficiencies (e.g., jitter, signal performance issues, reflection, etc.) based on the bit error testing performed implementing the user-defined pattern. Similarly, the user-defined pattern may also include sub-patterns each comprising a sequence of bits designed to target such deterministic or random errors. For example, sub-patterns may target a specific bandwidth. It may be noted that performing jitter analysis using the error testing device 36, instead of using a sampling scope, may have the advantage of providing an analysis based on real-life bits transmitted over a real digital transmission system under test and using the error testing device 36 to recover bit error test results, instead of using a conventional external clock recovery procedure with a scope, which might be susceptible to variations in performance.

Figure 3:
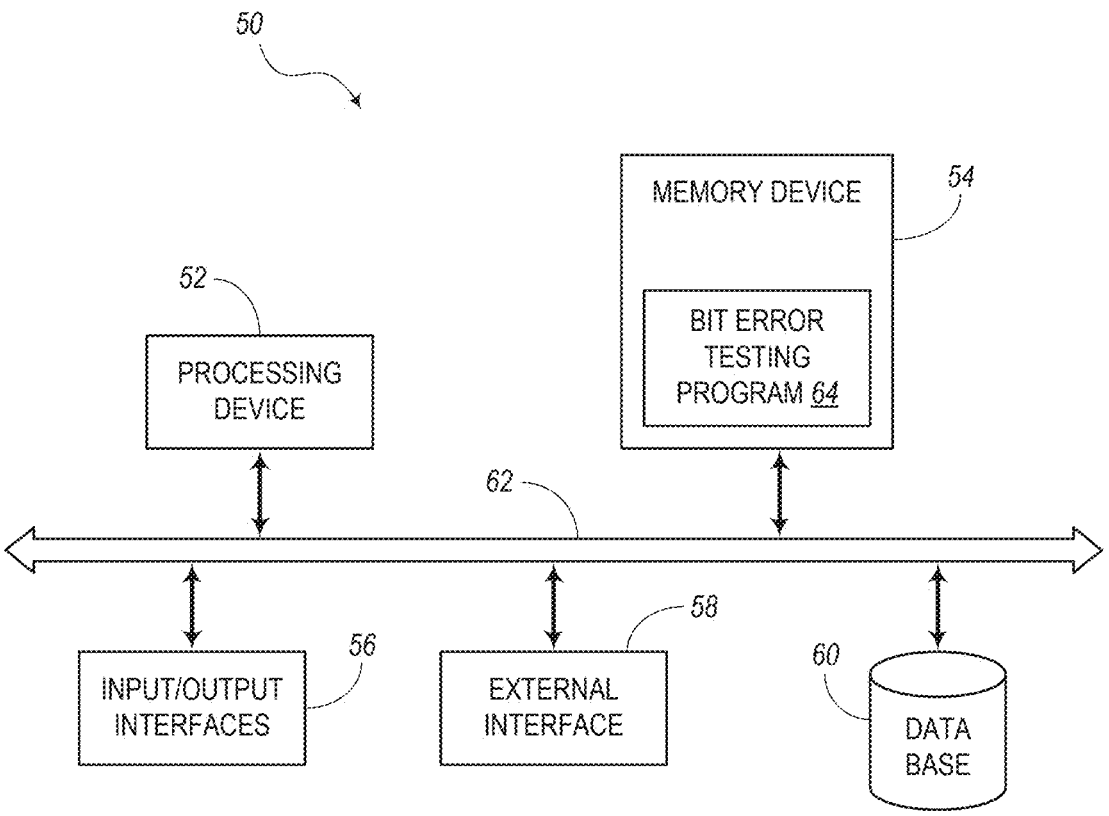
FIG. 3 is a block diagram illustrating the error testing device shown in FIG. 2, according to various embodiments.

FIG. 3 is a block diagram illustrating another embodiment of an error testing device 50 and may include the same or similar components and functionality as described with respect to the error testing device 36 shown in FIG. 2. In the illustrated embodiment, the error testing device 50 may be a digital computing device that generally includes a processing device 52, a memory device 54, Input/Output (I/O) interfaces 56, an external interface 58, and a database 60. It should be appreciated that FIG. 3 depicts the error testing device 50 in a simplified manner, where some embodiments may include additional components and suitably configured processing logic to support known or conventional operating features. The components (i.e., 52, 54, 56, 58, 60) may be communicatively coupled via a local interface 62. The local interface 62 may include, for example, one or more buses or other wired or wireless connections. The local interface 62 may also include controllers, buffers, caches, drivers, repeaters, receivers, among other elements, to enable communication. Further, the local interface 62 may include address, control, and/or data connections to enable appropriate communications among the components 52, 54, 56, 58, 60.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, at least one processor, circuit/circuitry, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

The error testing device 50 may include a bit error testing program 64, which may include the same or similar functionality as the error data analysis unit 44 shown in FIG. 2. For example, upon receiving a binary test sequence pattern generated by a pattern generator at an input to a digital communications system under test (e.g., where the binary test sequence pattern includes a plurality of sub-patterns) and receiving an output binary sequence from an output of the digital communications system, the error testing program 64 may be configured to compare the binary test sequence pattern with the output binary sequence to detect bit errors. Based on correlation characteristics between the bit errors and each of the sub-patterns, the error testing program 64 may also be configured to determine whether the bit errors are caused by random factors or are caused by deterministic factors associated with the digital communications system. The bit error testing program 64 may be implemented in any suitable combination of hardware, software, and/or firmware and/or may be stored in a non-transitory computer-readable medium (e.g., memory device 54) and executed by the processing device 52.

FIG. 4 is a flow diagram illustrating an embodiment of a method 70 for detecting bit errors and determining the cause of the bit errors. The method 70 may include the step of receiving a binary test sequence pattern generated by a pattern generator at an input to a digital communications system under test, as indicated in block 72. Particularly, the binary test sequence pattern may include a plurality of sub-patterns. The method 70 may further include the step of receiving an output binary sequence from an output of the digital communications system, as indicated in block 74. Furthermore, the method 70 may include the step of comparing the binary test sequence pattern with the output binary sequence to detect bit errors, as indicated in block 76. Based on correlation characteristics between the bit errors and each of the sub-patterns, the method 70 may further include the step of determining whether the bit errors are caused by random factors or are caused by deterministic factors associated with the digital communications system, as indicated in block 78.

The method 70 may also be characterized by additional features. For example, each sub-pattern may be configured to target certain types of deterministic factors associated with the digital communications system. The deterministic factors, for instance, may be related to the transmission bandwidth of the digital communications system. More specifically, bit errors that are distributed across sub-patterns may be indicative of errors caused by random factors, while bit errors substantially confined to specific sub-patterns may be indicative of errors caused by deterministic factors associated with the digital communications system.

In some embodiments, the method 70 may further include the step of determining one or more remediation procedures with respect to the digital communications system for reducing the number of errors caused by the deterministic factors associated with the digital communications system. The method 70 may further includes the step of detecting one or more of a bit error rate and a bit error ratio, wherein the bit error rate is based on the number of detected bit errors per unit time and the bit error ratio is based on the number of detected bit errors versus a total number of bits in the binary test sequence pattern.

Additionally, the binary test sequence pattern may be a Pseudo-Random Binary Sequence (PRBS) and/or a user-defined sequence. Also, each of the sub-patterns may have a predetermined binary sequence for targeting a specific characteristic of the digital communications system. In some embodiments, the method 70 may further include the step of analyzing the bit errors to extract metrics related to one or more of jitter, signal performance, and reflection. The method 70, in some implementations, may also include the step of instructing the pattern generator to incorporate error correction code according to Forward Error Correction (FEC) techniques to reduce the number of bit errors.

In some embodiments, a first group of sub-patterns may be defined as high-bandwidth sequences and a second group of sub-patterns may be defined as low-bandwidth sequences. Also, each sub-pattern may be repeated in the binary test sequence pattern multiple times. It may be noted that bit errors that are caused by deterministic factors associated with the digital communications system may be the result of transmission line faults, optical fiber faults, defective hardware, interference, distortion, reflection issues, bandwidth issues, excessive attenuation, among other factors. On the other hand, bit errors that are caused by random factors may be the result of noise, jitter, environmental factors, bit synchronization issues, among other factors.

The method 70 can also include the step of synchronizing the binary test sequence pattern with the output binary sequence to enable the binary test sequence pattern to be properly compared with the output binary sequence. The binary test sequence pattern, for example, may include more than $10^{20}$ bits. For example, a common pattern may be about $10^{23}$ bits in length. Some tests may include parallel processing to allow the analysis of root cause within a reasonable amount of time Also, the method 70 may further include the step of displaying waveforms, which may be indicative of bit errors, on an oscilloscope.

Although the present disclosure has been illustrated and described herein with reference to various embodiments and examples, it will be readily apparent to those of ordinary skill in the art that other embodiments and examples may perform similar functions, achieve like results, and/or provide other advantages. Modifications, additions, or omissions may be made to the systems, apparatuses, and methods described herein without departing from the spirit and scope of the present disclosure. All equivalent or alternative embodiments that fall within the spirit and scope of the present disclosure are contemplated thereby and are intended to be covered by the following claims.

What is claimed is:

1. A method comprising steps of:
   receiving a binary test sequence pattern generated by a pattern generator at an input to a digital communications system under test, the binary test sequence pattern including a plurality of sub-patterns;
   receiving an output binary sequence from an output of the digital communications system;
   comparing the binary test sequence pattern with the output binary sequence to detect bit errors; and based on correlation characteristics defined by a statistical relationship between the bit errors and occurrences of the plurality of sub-patterns, determining whether the bit errors are caused by random factors or are caused by deterministic factors associated with the digital communications system, wherein the correlation characteristics indicate random factors when the bit errors are substantially uniformly distributed across multiple sub-patterns, and indicate deterministic factors when the bit errors exhibit concentrated error peaks in one or more particular sub-patterns.

2. The method of claim 1, wherein each sub-pattern is configured to target certain types of deterministic factors associated with the digital communications system.

3. The method of claim 2, wherein the deterministic factors are related to a transmission bandwidth of the digital communications system.

4. The method of claim 1, wherein bit errors having error peaks focused on specific sub-patterns are indicative of errors caused by deterministic factors associated with the digital communications system.

5. The method of claim 4, further comprising the step of determining one or more remediation procedures with respect to the digital communications system for reducing a number of errors caused by the deterministic factors associated with the digital communications system.

6. The method of claim 1, further comprising the step of detecting one or more of a bit error rate and a bit error ratio, wherein the bit error rate is based on a number of detected bit errors per unit time and the bit error ratio is based on the number of detected bit errors versus a total number of bits in the binary test sequence pattern.

7. The method of claim 1, wherein the binary test sequence pattern is one of a Pseudo-Random Binary Sequence (PRBS) and a user-defined sequence, and wherein each of the sub-patterns has a predetermined binary sequence for targeting a specific characteristic of the digital communications system.

8. The method of claim 1, further comprising the step of analyzing the bit errors to extract metrics related to one or more of jitter, signal performance, and reflection.

9. The method of claim 1, further comprising the step of instructing the pattern generator to incorporate error correction code according to Forward Error Correction (FEC) techniques to reduce a number of bit errors.

10. The method of claim 1, wherein a first group of sub-patterns are defined as high-bandwidth sequences and a second group of sub-patterns are defined as low-bandwidth sequences.

11. The method of claim 1, wherein each sub-pattern is repeated in the binary test sequence pattern multiple times.

12. The method of claim 1, wherein bit errors that are caused by deterministic factors associated with the digital communications system are a result of one or more of transmission line faults, optical fiber faults, defective hardware, interference, distortion, reflection issues, bandwidth issues, and excessive attenuation, and wherein bit errors that are caused by random factors are a result of one or more of noise, jitter, environmental factors, and bit synchronization issues.

13. The method of claim 1, further comprising the step of synchronizing the binary test sequence pattern with the output binary sequence to enable the binary test sequence pattern to be compared with the output binary sequence.

14. The method of claim 1, wherein the binary test sequence pattern includes more than $10^{20}$ bits.

15. The method of claim 1, wherein the binary test sequence pattern is applied to the input of the digital communications system at a rate of at least 10 Gbps.

16. The method of claim 1, further comprising the step of displaying waveforms indicative of the bit errors on an oscilloscope.

17. An error testing device comprising:
a processing device; and
a memory device configured to store a computer program having instructions that, when executed, enable the processing device to
    receive a binary test sequence pattern generated by a pattern generator at an input to a digital communications system under test, the binary test sequence pattern including a plurality of sub-patterns,
    receive an output binary sequence from an output of the digital communications system,
    compare the binary test sequence pattern with the output binary sequence to detect bit errors, and
    based on correlation characteristics defined by a statistical relationship between the bit errors and occurrences of the plurality of sub-patterns, determine whether the bit errors are caused by random factors or are caused by deterministic factors associated with the digital communications system, wherein the correlation characteristics indicate random factors when the detected bit errors are distributed across multiple sub-patterns, and indicate deterministic factors when the detected bit errors are concentrated in one or more sub-patterns.

18. The error testing device of claim 17, wherein each sub-pattern is configured to target certain types of deterministic factors associated with the digital communications system, and wherein the deterministic factors are related to a transmission bandwidth of the digital communications system.

19. A non-transitory computer-readable medium configured to store an error data analysis unit having computer logic that, when executed, enable one or more processing devices to:
    receive a binary test sequence pattern generated by a pattern generator at an input to a digital communications system under test, the binary test sequence pattern including a plurality of sub-patterns;
    receive an output binary sequence from an output of the digital communications system;
    compare the binary test sequence pattern with the output binary sequence to detect bit errors; and
    based on correlation characteristics representing a mapping between the bit errors and specific sub-patterns of the binary test sequence pattern, determine whether the bit errors are caused by random factors or are caused by deterministic factors associated with the digital communications system, wherein the correlation characteristics indicate deterministic factors when bit errors are concentrated within one or more sub-patterns, and indicate random factors when bit errors are relatively uniformly distributed across the plurality of sub-patterns.

20. The non-transitory computer-readable medium of claim 19, whereby bit errors having error peaks focused on sub-patterns are indicative of errors caused by deterministic factors associated with the digital communications system.

* * * * *